US012063742B1

(12) United States Patent
Jandhyala et al.

(10) Patent No.: US 12,063,742 B1
(45) Date of Patent: Aug. 13, 2024

(54) PRINTED CIRCUIT BOARD WITH EMBEDDED COIL AND POSITION SENSOR

(71) Applicant: Apple Inc., Cupertino, CA (US)

(72) Inventors: Sai Harsha Jandhyala, Cupertino, CA (US); Himesh Patel, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 139 days.

(21) Appl. No.: 17/715,852

(22) Filed: Apr. 7, 2022

Related U.S. Application Data

(60) Provisional application No. 63/172,608, filed on Apr. 8, 2021.

(51) Int. Cl.
H05K 1/18 (2006.01)
G03B 5/04 (2021.01)
G03B 13/36 (2021.01)
H02K 41/035 (2006.01)
H04N 23/54 (2023.01)
H04N 23/55 (2023.01)
H04N 23/67 (2023.01)
H04N 23/68 (2023.01)
H05K 3/30 (2006.01)

(52) U.S. Cl.
CPC .............. H05K 1/181 (2013.01); G03B 5/04 (2013.01); G03B 13/36 (2013.01); H02K 41/0354 (2013.01); H04N 23/54 (2023.01); H04N 23/55 (2023.01); H04N 23/67 (2023.01); H04N 23/687 (2023.01); H05K 3/303 (2013.01); G03B 2205/0069 (2013.01); H05K 2201/1009 (2013.01); H05K 2201/10151 (2013.01)

(58) Field of Classification Search
CPC .................. H05K 1/181; H05K 3/303; H05K 2201/1009; H05K 2201/10151; G03B 5/04; G03B 13/36; G03B 2205/0069; H02K 41/0354; H04N 23/54; H04N 23/55; H04N 23/67; H04N 23/687
See application file for complete search history.

(56) References Cited

U.S. PATENT DOCUMENTS

| 5,045,922 | A | * | 9/1991 | Kodama | H05K 1/0206 257/E23.173 |
| 9,442,285 | B2 | | 9/2016 | Rogers | |
| 9,995,902 | B2 | * | 6/2018 | Baik | G02B 7/08 |
| 10,594,910 | B2 | | 3/2020 | Lee et al. | |
| 10,840,835 | B2 | | 11/2020 | Yu et al. | |
| 2010/0237718 | A1 | * | 9/2010 | Tsai | G02B 7/022 324/207.11 |
| 2015/0116514 | A1 | * | 4/2015 | Kim | G02B 27/646 348/208.4 |

(Continued)

Primary Examiner — Jason A Flohre
(74) Attorney, Agent, or Firm — Robert C. Kowert; Kowert, Hood, Munyon, Rankin & Goetzel, P.C.

(57) ABSTRACT

A camera may include a printed circuit board (PCB) that may include at least one coil and at least one position sensor. The coil may be embedded at least partially inside the PCB at a first side of the PCB, whilst the position sensor may be attached to the PCB at a second side opposite the first side. The PCB may include an aperture through the PCB at a location corresponding to the position sensor to enhance sensing of the position sensor. The PCB may further include at least one recess inside which the position sensor may be attached to the PCB.

18 Claims, 9 Drawing Sheets

(56) References Cited

U.S. PATENT DOCUMENTS

| | | | |
|---|---|---|---|
| 2015/0365568 A1* | 12/2015 | Topliss | H02K 41/0356 |
| | | | 348/360 |
| 2018/0287478 A1* | 10/2018 | Kao | H02K 41/0356 |
| 2019/0020822 A1* | 1/2019 | Sharma | H02K 41/0354 |
| 2019/0235202 A1* | 8/2019 | Smyth | G03B 5/00 |
| 2020/0036565 A1 | 1/2020 | Lim et al. | |
| 2021/0302690 A1* | 9/2021 | Lin | G02B 7/09 |
| 2022/0326047 A1* | 10/2022 | Ku | H10N 52/80 |

* cited by examiner

| Layers of a PCB | Thickness of layers at an area with a recess | Thickness of layers at an area without recess |
|---|---|---|
| Protective layer at a first side | h(pl) | h(pl) |
| Routing layer 1 | h(rl1) | h(rl1) |
| Insulation layer 1 | h(il1) | h(il1) |
| Routing layer 2 | h(rl2) | h(rl2) |
| Insulation layer 2 | h(il2) | h(il2) |
| Routing layer 3 | h(rl3) | h(rl3) |
| Insulation layer 3 | h(il3) | h(il3) |
| Routing layer 4 | h(rl4) | h(rl4) |
| Core (e.g., polyimide layer) | h(c) | h(c) |
| Routing layer 5 | h(rl5) | h(rl5) |
| Insulation layer 5 | Recess | h(il5) |
| Routing layer 6 | Recess | h(rl6) |
| Insulation layer 6 | Recess | h(il6) |
| Routing layer 7 | Recess | h(rl7) |
| Insulation layer 7 | Recess | h(il7) |
| Routing layer 8 | Recess | h(rl8) |
| Insulation layer 8 | h(il8) | h(il8) |
| Protective layer at a second side | h(pl) | h(pl) |

FIG. 3B

PRINTED CIRCUIT BOARD WITH EMBEDDED COIL AND POSITION SENSOR

This application claims benefit of priority to U.S. Provisional Application Ser. No. 63/172,608, entitled "Printed Circuit Board with Embedded Coil and Position Sensor," filed Apr. 8, 2021, and which is hereby incorporated herein by reference in its entirety.

BACKGROUND

Technical Field

This disclosure relates generally to a camera and more specifically to a camera that may include a printed circuit board (PCB) where one or more coils may be at least partially embedded and/or one or more position sensors may be attached.

Description of the Related Art

Mobile multipurpose devices such as smartphones, tablet, and/or pad devices are considered as a necessity nowadays. They integrate various functionalities in one small package thus providing tremendous convenience for use. Most, if not all, of today's mobile multipurpose devices include at least one camera. Some cameras may incorporate an autofocus (AF) mechanism whereby the object focal distance can be adjusted to focus an object plane in front of a camera at an image plane to be captured by the image sensor. In some cameras, the AF mechanisms can be implemented by moving the optical lenses as a single rigid body along the optical axis of the camera. Furthermore, some cameras may incorporate an optical image stabilization (OIS) mechanism that can sense and react to external excitation/disturbance by adjusting position of the image sensor relative to the lenses in an attempt to compensate for unwanted motion of the lenses. The advent of the mobile multipurpose devices has resulted in a high requirement for cameras, in terms of image quality but also size of the cameras. Therefore, it is desirable to have techniques capable of reducing the footprint of cameras in mobile multipurpose devices.

BRIEF DESCRIPTION OF THE DRAWINGS

FIG. 3B is a table showing an example structure of a PCB at two areas with and without a recess, according to some embodiments.

Figure 1A:
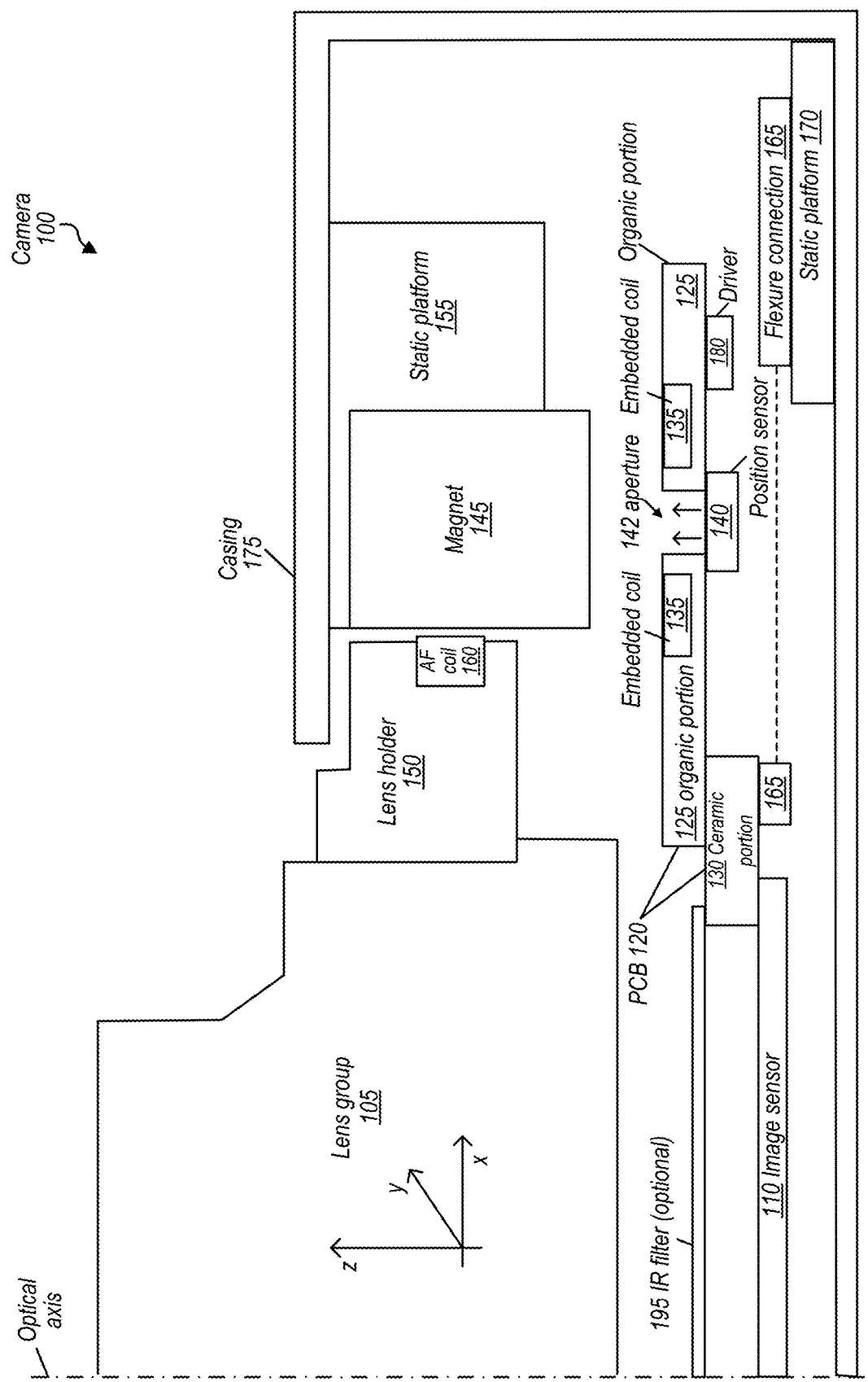
FIGS. 1A-1D show an example camera including a printed circuit board (PCB), according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments described herein relate to a camera that may include a printed circuit board (PCB) where one or more coils may be at least partially embedded and/or one or more position sensors may be attached. In some embodiments, the PCB may be preferably rigid in the areas where the coils are embedded, but that the overall PCB may be a rigid PCB or a rigid-flex PCB (e.g., where the coils are embedded into a rigid portion of the rigid-flex PCB). In some embodiments, the camera may include an image sensor and a lens group having one or more lenses. The lens group may receive light from an external environment and pass the light to the image sensor. The image sensor may receive the light passing through the lens group and accordingly generate image signals, e.g., electrical signals. The image signals may be further processed by a processor to render an image for display. The PCB with associated coils and position sensors may be used in a variety of different camera application. For instance, in an instance where the camera has a moveable image sensor, the camera may have an assembly that is configured to hold the image sensor and one or more coils. The PCB portion of the assembly may utilize the coil and/or position sensor mounting techniques described herein. In some embodiments, the cameras may be integrated as part of a mobile multipurpose device such as a smartphone, a tablet, a pad device, and the like.

In some embodiments, the camera may include an actuator, e.g., a voice coil motor (VCM) actuator, that may move the lens group and/or the image sensor relative to each other. For instance, the actuator may control the lens group to move relative to the image sensor from one position to another, e.g., in a direction approximately parallel to the optical axis (or Z-axis) of the lens group of the camera to implement an autofocus (AF) function. In some embodiments, the actuator may also move the image sensor relative to the lens group to different positions in one or more directions, e.g., along X- and/or Y-axis, that are approximately orthogonal to the optical axis (or Z-axis) of the lens group to implement an optical image stabilization (OIS) function. In some embodiments, instead of moving both components, the actuator may move either the lens group or the image sensor alone, e.g., along (1) Z-axis and (2) X- and/or Y-axis, to implement both the AF and OIS functions.

In some embodiments, the camera may include an assembly for mounting various components of the camera. For instance, the assembly may include a PCB, at least one coil of the actuator, and at least one position sensor. In some embodiments, the coil of the actuator may be embedded or buried at least partially inside the PCB at a first side of the PCB, and the position sensor may be mounted or attached to the PCB at a second side opposite the first side of the PCB. The coil may conduct current that may interact with the magnetic field of at least one corresponding magnet to generate motive force (e.g., Lorentz force) for moving the lens group and/or the image sensor. The position sensor may be used for measurement to provide information indicating a relative distance between the lens group and the image sensor. This relative distance may be further used as a parameter in control of the movement and/or position of the lens group and/or the image sensor by the actuator. Here, the term "position sensor" may broadly refer to any type of sensors suitable for measuring the distance, position, direction, and/or speed of one object (e.g., the coil) relative to another object (e.g., the magnet). For instance, the positions sensor may include a magnetoresistive (MR) sensor (e.g., a giant magnetoresistive or GMR sensor, a tunneling magnetoresistive or TMR sensor, an anisotropic magnetoresistive or AMR sensor, etc.), a Hall effect-based magnetic sensor, an eddy current-based sensor, a capacitive position sensor, an inductive position sensor, a potentiometric position sensor (resistance-based), a fiber-optic position sensor, an optical position sensor, an ultrasonic position sensor, and the like.

In some embodiments, the PCB may include at least one aperture or opening through the PCB in order to enhance the sensing of the position sensor. For instance, in some embodiments, the magnet of the camera may be placed proximate the first side of the PCB. Because the position sensor is attached to the (opposite) second side of the PCB, an aperture may be created through the PCB proximate the position sensor (e.g., the aperture may be positioned approximately "in-between" the magnet and the position sensor) to reduce the magnetoresistance (i.e., the "friction" of the magnetic field) for the position sensor. In addition, in some embodiments, the position sensor may be designed such that, when attached to the second side of the PCB, it may provide a larger sensing output than attached in the opposite direction. Typically, a position sensor has better sensing performance when the magnet is at the opposite side compared to the leads of the package of the position sensor. In other words, for instance, when the position sensor is a surface mount device mounted to a underneath side of a PCB, its sensing output is larger when the magnet is underneath the PCB (e.g., at the opposite side with respect to the surface-mounting leads) than the scenario when the magnet is above the PCB (e.g., at the same side as the leads). However, in this disclosure, due to the "custom" design, the position sensor may have a stronger sensing output when the magnet is positioned at the same side (e.g., above the PCB or proximate the top side of the PCB) as the leads relative to the position sensor, given the aperture through the PCB.

In some embodiments, the PCB may include at least a recess such that the height or thickness of the PCB at the location of the recess may become less than other parts of the PCB. The position sensor may be attached to the PCB inside the recess so as to reduce the height or thickness of the overall assembly (e.g., a sum of the heights or thicknesses of the PCB at the recess and the position sensor attached to the PCB). In some embodiments, the PCB may further include at least one driver (e.g., an integrated-circuit component) that may be used to control and regulate the current of the coil of the actuator. In some embodiments, the driver may be attached to the PCB at the same side, e.g., the second side, of the PCB as the position sensor. In some embodiments, the PCB may include an organic portion and a ceramic portion.

The above-described embedded coil, position sensor, and/or driver may be attached to the organic portion of the PCB. In some embodiments, the ceramic portion may be attached to the organic portion at the same side, e.g., the second side, of the PCB as the position sensors. In some embodiments, the PCB may include one or more additional recesses such that the driver and/or the ceramic portion may be attached to the PCB also inside the additional recesses, in order to reduce the overall height or thickness of the PCB. In some embodiments, the camera may further include at least an additional coil that may be electrically coupled with the embedded coil but positioned outside the PCB, e.g., at the first side of the PCB. In some embodiments, the additional coil may have a higher coil density than the embedded coil. For instance, the additional coil may be wound in a way to reduce airgap between windings of the additional coil and/or provide a higher number of turns within a same volume, and/or may use a different conductor or power supply to obtain a higher current. In some embodiments, the image sensor and the additional coil may be the only components mounted at the first second side of the PCB. In other words, all the other components may be either embedded inside the PCB or attached to the second side of the PCB As described above, in some embodiments, the PCB may be preferably rigid in the areas where the one or more coils are embedded, e.g., to avoid impacting performance of the embedded coils. However, the overall PCB may be a rigid PCB (such as a hardboard) or a rigid-flex PCB (such as a combination of one or more hardboards and one or more flexible circuits connected to the hardboards). In the case when the overall PCB is a rigid-flex PCB, the coils may be embedded at least partially into a rigid portion of the rigid-flex PCB.

The PCB arrangement described in this disclosure can provide at least several benefits. One, it can reduce the height or thickness of the overall assembly, which may further lead to the reduction of the overall camera footprint. Consider an example where the image sensor is attached to the PCB and positioned upon the X-Y plane to receive light passing through the lens group along the optical axis (or Z-axis) of the lens group. Embedding the coil at least partially inside the PCB, e.g., at a top side of the PCB, may reduce the height or thickness of the overall assembly along Z-axis (e.g., the Z-height) compared to traditional designs where the coil is mounted outside on top of the PCB. Further, in such an example camera, typically the magnet is positioned above the PCB, and the position sensor is attached at the same side (e.g., the top side) of the PCB as the coil. However, there may be readily-available space between the underneath side of the PCB and casing of the camera that would otherwise be unoccupied in traditional designs, according to some embodiments. Therefore, moving the position sensor from the top side to the underneath side of the PCB, using the readily-available space, can further reduce the Z-height of the PCB. Note that this is only an example to illustrate the size reduction, e.g., along Z-axis. Depending on the orientation of the PCB installation inside the camera, the disclosed design may also reduce the size of the PCB and/or footprint of the camera in the other directions (e.g., size reduction along the X- and/or Y-axis when the PCB is arranged vertically). Two, the disclosed design can simplify the manufacturing process of the PCB. For instance, traditionally, the position sensor, driver, and/or the ceramic portion of the PCB are positioned at different sides of the PCB. Therefore, it requires multiple reflow processes to mount or attach (e.g., using soldering) these components to the PCB (e.g., to an organic portion of the PCB). However, according to the disclosed design, these components may now move to the same side of the PCB, and therefore they can be attached to the PCB in one single reflow. Every time the PCB goes through a reflow process, it has to experience some thermal cycles and associated differential thermal expansions. Therefore, the simplification of the manufacturing process can also improve the reliability of the PCB as well as reduce warpages. Three, the disclosed PCB arrangement can also improve the sensing performance of the position sensor. Traditionally, when the position sensor and coil are positioned at the same side of the PCB, the position sensor may be subject to saturation. This can happen when the magnet is too close to the coil (and thus the position sensor) for increasing the magnetic field and thus the motive force, e.g., in order to improve dynamic response and/or move a larger and heavier movable component. In the disclosed design, the position sensor may be placed at the opposite side of PCB compared to the coil and magnet, and therefore the saturation may be eliminated or at least mitigated. The sensing performance of the position sensor may be still guaranteed by creating an aperture through the PCB corresponding to the position sensor. Therefore, the camera can retain or even increase the motive force without sacrificing performance of the position sensor.

FIGS. 1A-1D show an example camera including the disclosed PCB arrangement, according to some embodiments. For purposes of illustration, only relevant components are illustrated in these figures. FIG. 1A shows a (partial) cross-sectional view of the example camera. In this example, camera 100 may include lens group 105 and image sensor 110. Lens group 105 may include one or more lenses (not shown), which may receive light from an external environment and focus the light on to an image plane of image sensor 110. Image sensor 110 may generate image signals based on the light passing through lens group 105. The image signals may be further processed by a processor to render an image for display. In some embodiments, camera 100 may include infrared (IR) filter 195 that may block at least some IR light from reaching image sensor 110. For purposes of illustration, in this example, the optical axis of lens group 105 is designated as the Z-axis, and the image sensor 110 is shown to sit upon the X-Y plane orthogonal to the optical axis (or Z-axis) of lens group 105. In some embodiments, camera 100 may include printed circuit board (PCB) 120 that may be used for mounting various components of camera 100. In this example, for purposes of illustration, PCB 120 may include organic portion 125 and ceramic portion 130, according to some embodiments.

As described above, in some embodiments, camera 100 may include at least one actuator that may be used to move lens group 105 and/or image sensor 110 to implement AF and/or OIS functions. For instance, as shown in FIG. 1A, camera 100 may include AF coil 160 of an actuator that may be fixedly coupled with lens holder 150. Lens holder 150 may contain the one or more lenses of lens group 105. For instance, lens holder 150 may include interior threads, and the one or more lenses of lens group 105 may be screwed in to the threads to become attached to lens holder 150. Camera 100 may include at least one magnet 145 arranged proximate AF coil 160, as shown in FIG. 1A. Magnet 145 may be attached with static platform 155 that further be fixedly coupled with casing 175 of camera 100. In some embodiments, camera 100 may include a flexure connection (not shown), e.g., a horizontal connection between lens holder 150 and static platform 155, which may provide necessary support for lens holder 150 but also allow for freedom of movement for lens holder 150, e.g., in a directional approximately parallel to the optical axis (or Z-axis) of lens group 105. Therefore, when AF coil 160 conducts current, the current may interact with the magnetic field of magnet 145 to generate motive force (e.g., Lorentz force) upon AF coil 160 to move AF coil 160 (together with lens holder 150 and lens group 105) relative to image sensor 110 approximately along Z-axis to implement the AF function.

In addition, in some embodiments, camera 100 may also use the same or a different actuator to move image sensor 110 relative to lens group 105. For instance, as shown in FIG. 1A, in some embodiments, image sensor 110 may be fixedly coupled with PCB 120, e.g., using a chip socket or being soldered directly on to connector(s) on ceramic portion 130 of PCB 120. Ceramic portion 130 of PCB 120 may be further coupled with static platform 170 through a flexure connection 165. Flexure connection 165 may allow for movement of PCB 120 (and thus image sensor 110) relative to lens group 105, e.g., in one or more directions (e.g., along X- and/or Y-axis) approximately orthogonal to the optical axis (or Z-axis) of lens group 105. Camera 100 may include at least one OIS coil 135 that may be at least partially embedded inside PCB 120. For instance, coil 135 may be at least partially embedded within one or more layers at a first side of organic portion 125 of PCB 125 that faces lens group 105. As shown in FIG. 1A, magnet 145 may be arranged proximate coil 135, such that the magnetic field of magnet 145 and the current of coil 135 may interact with each other to generate motive force (e.g., Lorentz force) to move image sensor 110 relative to lens group 105, e.g., approximately along X- and/or Y-axis to implement the OIS function.

In some embodiments, camera 100 may include position sensor 140 that may be used to provide information indicating a relative distance between lens group 105 and image sensor 110, which may be used in control of the movement and/or position of image sensor 110 relative to lens group 105. In some embodiments, position sensor 140 may be attached to a second side of PCB 120 opposite the first side and facing away from lens group 105, e.g., within the space between PCB 120 and casing 175 of camera 100 as shown in FIG. 1A. As described above, the underneath space between PCB 120 and casing 175 of camera 100 may be readily available, and thus embedding coil 135 inside PCB 120 and attaching position sensor 140 to the opposite side of PCB 120 can reduce the height or thickness (e.g., the Z-height in this example) of the overall assembly. As shown in FIG. 1A, because position sensor 140 is now moved to the underneath side of PCB 120, PCB 120 may include aperture 142 through PCB 120 corresponding to position sensor 140. For instance, aperture 142 may be located approximately above position sensor 140 to create an airgap in-between position sensor 140 and magnet 145. Aperture 142 can reduce the magnetoresistance of the magnetic field of magnet 145 for position sensor 140 and thus enhance the sensing of position sensor 140.

In addition, in some embodiments, position sensor 140 may be designed such that, when attached to the underneath side of PCB 120 as shown in FIG. 1A, position sensor 140 may provide a larger sensing output than attached in the opposite direction. In other words, position 140 sensor may have a larger sensing output when magnet 145 is positioned above the top side of PCB 120 (e.g., at the same side as the leads of position sensor 140) than the scenario when magnet 145 is underneath PCB 120. For purposes of illustration, FIG. 1A shows the upward arrows to indicate this "sensing direction" for position sensor 140.

As shown in FIG. 1A, in some embodiments, PCB 120 may include both organic portion 120 and ceramic portion 130. In that case, ceramic portion 130 may be attached to organic portion 125 of PCB 120 at the same side, e.g., the underneath side, as position sensor 140, according to some embodiments. In addition, in some embodiments, camera 100 may include driver 180 (e.g., an IC component) for coil 135 that may be attached to PCB 120 at the same side, e.g., the underneath side, as position sensor 140. As described above, the PCB arrangement described herein of having components such as position sensor 140, ceramic portion 130 of PCB 120, and/or driver 180 at the same side of PCB 120 may simplify the manufacturing process, which may further improve the reliability and reduce warpage. Further, as described above, the attachment of position sensor 140 at the opposite side as coil 135 can improve the sensing performance, e.g., by eliminating or at least mitigating saturation of position sensor 140. In some embodiments, PCB 120 may include one or more recesses such that position sensor 140, driver 180, and/or ceramic portion 130 may be attached to organic portion 125 inside the recesses to further reduce the overall height or thickness of the PCB, as described in FIG. 2.

Figure 1B:
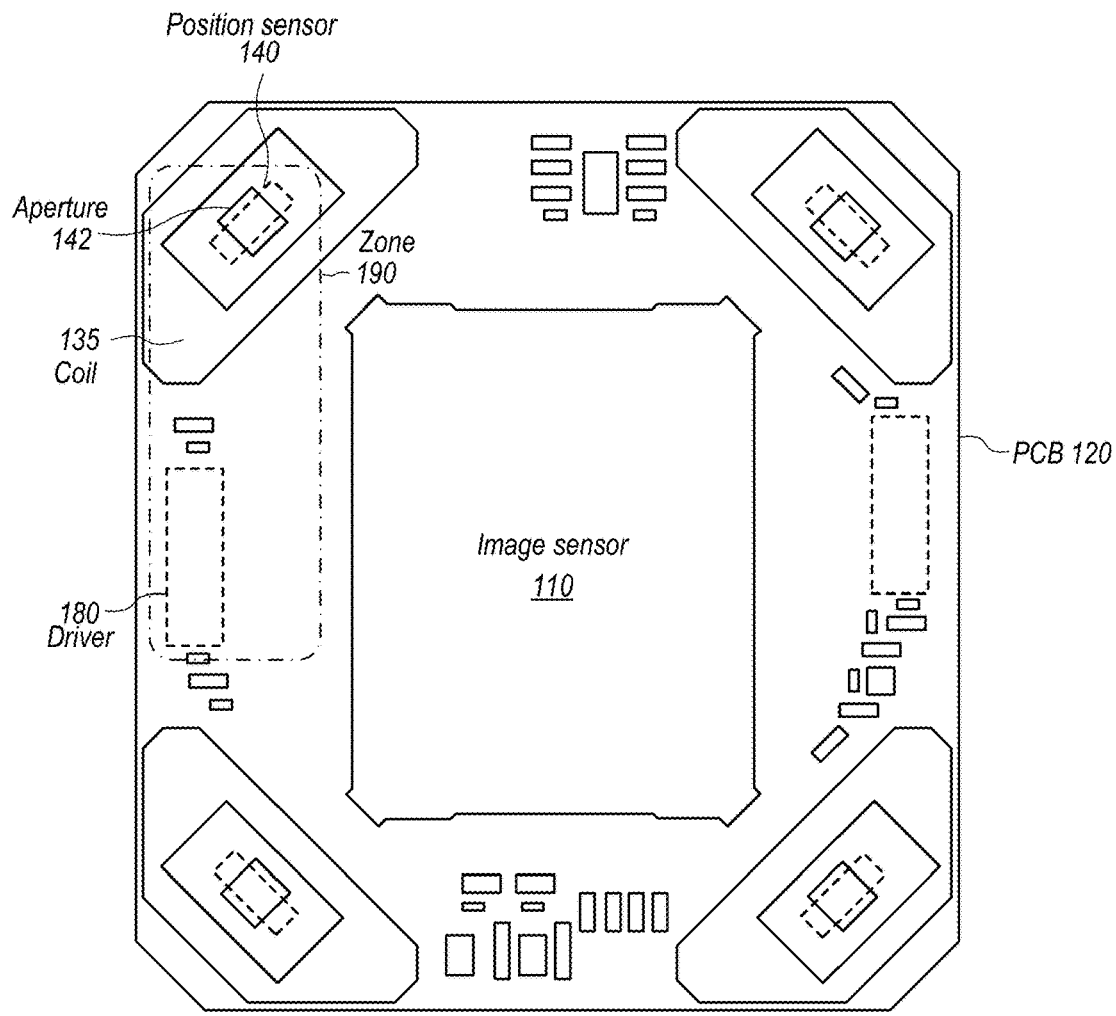

FIG. 1B shows a top view of the PCB, according to some embodiments. As shown in FIG. 1B, PCB 120 may include at least one coil 135 and at least one position sensor 140. In FIG. 1B, position sensor 140 is shown with dashed lines because it is attached to the underneath side of PCB 120 and thus not directly visible in the top view. Further, PCB 120 may include aperture 142 through PCB 120 corresponding to position sensor 140. As shown in FIG. 1B, in this example, aperture 142 may be created at a location proximate position sensor 140, e.g., approximately above position sensor 140. In addition, in some embodiments, at least one driver 180 for coil 135 may be attached to the same side (e.g., the underneath side) of PCB 120 as position sensor 140—thus driver 180 is also shown with dashed lines in FIG. 1B. Note that moving driver 180 to the underneath side of PCB 120 (e.g., opposite to coil 135) may also provide additional possibility to reduce the size of the overall assembly. For instance, as shown in FIG. 1B, this can provide additional space, e.g., along the west and/or east sides on the X-Y plane, at the top side of PCB 120.

Figure 1C:
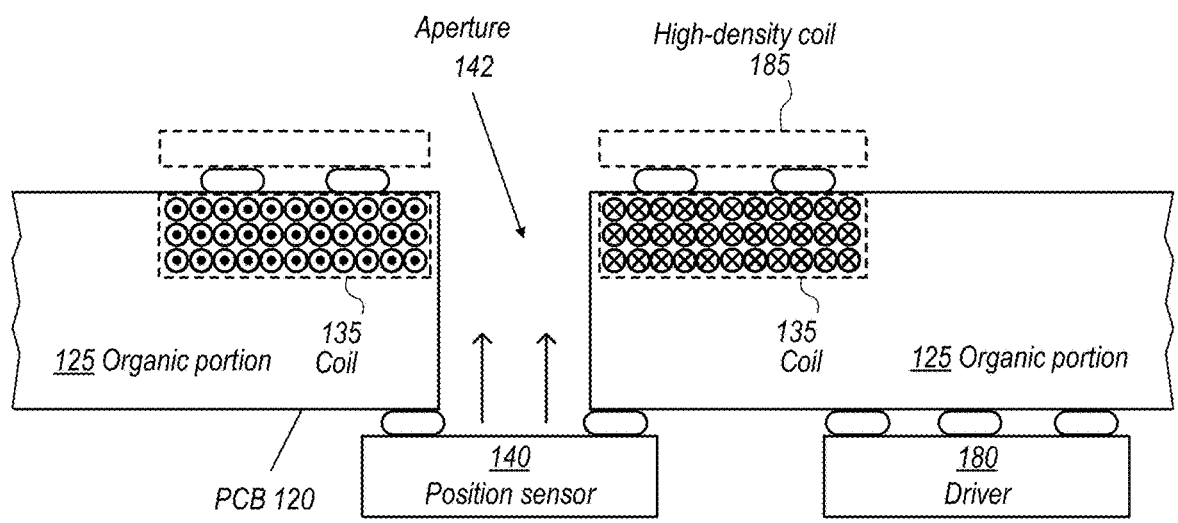

FIG. 1C shows a cross-sectional zoom-in view of the PCB, according to some embodiments. In this example, the figure corresponds to a cross-sectional view, from left to right, of zone 190 as indicated in FIG. 1B. As shown in FIG. 1C, PCB 120 may include at least one coil 135 and at least one position sensor 140, according to some embodiments. In some embodiments, coil 135 may be embedded at least partially inside PCB 120, e.g., within the three layers of organic portion 125 of PCB 120 at the first side, as shown in FIG. 1C. Position sensor 140 may be attached to PCB 120 at the second side opposite to the first side of PCB 120. In addition, PCB 120 may include aperture 142, e.g., approximately above position sensor 140 as shown in FIG. 1C. In some embodiments, position sensor 140 may be designed to provide a larger sensing output when attached to the second side of PCB 120 (as shown in FIG. 1C) than attached in an opposite direction, as indicated by the upward "sensing direction" in FIG. 1C. In some embodiments, at least one driver 180 for coil 135 may be attached to PCB 120 at the same side, e.g., the second side, as position sensor 140. In addition, in some embodiments, camera 100 may include at least one additional coil 185 that may be positioned outside PCB 120, e.g., at the first side of PCB 120, and may be electrically connected with embedded coil 135. In some embodiments, additional coil 185 may provide a higher density than embedded coil 135. For instance, additional coil 185 may have a higher winding density, a larger number of turns, and/or a larger current.

Figure 1D:
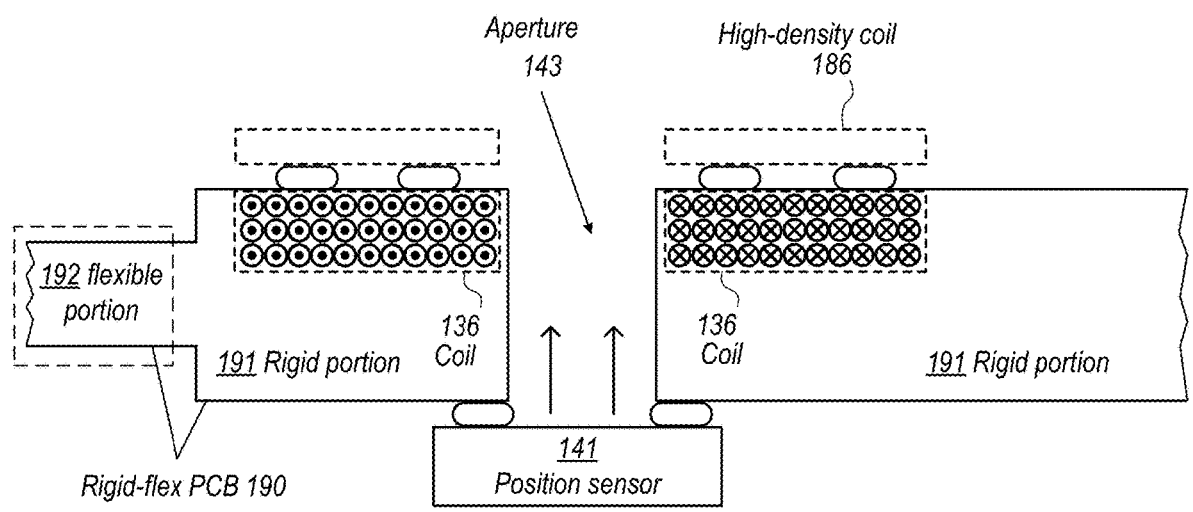

As described above, in some embodiments, the PCB may be preferably rigid in the areas where the coils are embedded—e.g., organic portion 125 of PCB 120 inside which coils 135 is embedded may be preferably a rigid portion. However, the overall PCB may be a rigid PCB or a rigid-flex PCB. FIG. 1D shows an example rigid-flex PCB. In FIG. 1D, rigid-flex PCB 190 may include rigid portion 191 and flexible portion 192. For instance, rigid portion 191 may correspond to a hardboard, whilst flexible portion 192 may be a flexible circuit that may include traces connected with traces inside rigid portion 191. One or more coils 136 may be embedded at least partially inside rigid-flex PCB 190, e.g., into a first side of rigid portion 191. Further, one or more position sensors 141 may be attached to rigid-flex PCB 190 at a second side opposite to embedded coils 136. In some embodiments, rigid-flex PCB 190 may include one or more apertures 143 through rigid-flex PCB 190 at locations corresponding to position sensors 141 to enhance sensing of position sensors 141. In addition, in some embodiments, one or more additional coils 186 positioned outside rigid-flex PCB 190 may be coupled with embedded coils 136.

Note that FIGS. 1A-1D are provided only as an example for purposes of illustration. In some embodiments, image sensor 110 may be mounted at another side of PCB 120 (e.g., at the top side of PCB 120 in FIG. 1A) that faces lens group 102. Further, the PCB may be used to hold a variety of different camera components and be arranged in different orientations. For instance, in some embodiments, a PCB may not necessarily be used to hold the image sensor, but rather be arranged vertically in parallel to the Z-axis and used to transfer power and/or signals to one or more coils attached with the lens holder (e.g., AF coil 160 in FIG. 1A). Moreover, the PCB may be made of one single material (e.g., organic material, ceramic, or any other appropriate PCB material), or a combination of different materials (e.g., including an organic portion and a ceramic portion). In addition, as described above, in some embodiments, camera 100 may move image sensor 110 in one or more additional directions, e.g., approximately along the optical axis (or Z-axis) of lens group 105 to implement the AF function. Note that a camera may include one or more PCB assemblies as described herein. For instance, in some embodiments, a camera may include one PCB as described herein to hold the image sensor (e.g., on X-Y plane), and another PCB as described here (e.g., in parallel to Z-axis) to transfer power and/or signals to other camera components (e.g., the AF coil).

In some embodiments, the embedding of coil 135 at least partially inside PCB 120 may be implemented using various appropriate approaches. For instance, in some embodiments, embedded coil 135 may be created using an electroplating process, such as a 3-D copper plating. For example, a conductive material such as copper may be deposited at one layer of PCB 120. Then, PCB 120 may be etched according to a given winding pattern of coil 135 to form one layer of windings for embedded coil 135. Next, an insulation layer may be applied on top of and/or underneath this layer, and the above processes may be repeated at another layer of PCB 120 as needed to form one or more additional layers of windings for embedded coil 135. Finally, a protective layer may be applied to encapsulate embedded coil 135. Note that PCB 135 may further include vias and/or other connections for connecting the windings of embedded coil 135 at different layers.

Figure 2A:
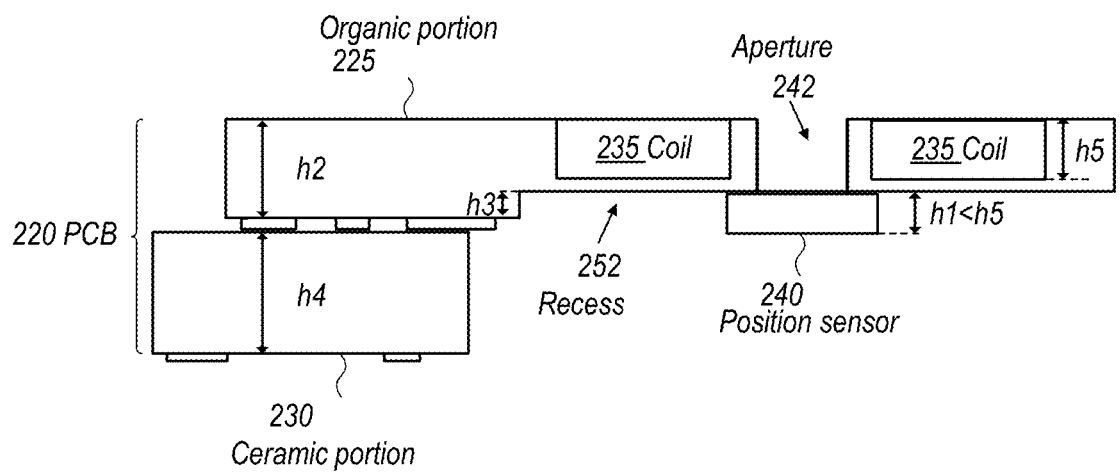
FIGS. 2A-2B show cross-sectional views of example PCB designs to illustrate size reduction, according to some embodiments.
Figure 2B:
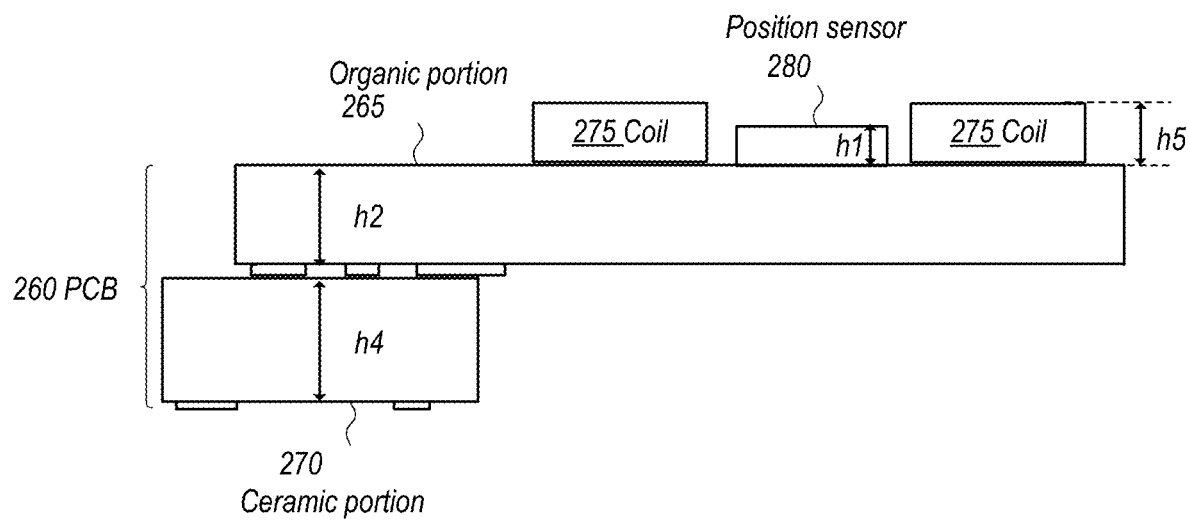

FIGS. 2A-2B show cross-sectional views of two example designs to illustrate the size reduction of the PCB, according to some embodiments. For purposes of illustration, in this example, PCB 220 (and 260) are shown to include organic portion 225 (and 265) and ceramic portion 230 (and 270). As shown in FIG. 2A, at least one coil 235 embedded inside PCB 220 at a first side of PCB 220, and at least one position sensor 240 attached to PCB 220 at a second side opposite the first side of PCB 220. Further, PCB 220 may include recess 252, and position sensor 240 may be placed at least partially inside recess 252. By comparison, in FIG. 2B, at least one coil 272 is not embedded but rather mounted on top of PCB 260. Further, in FIG. 2B, at least one position sensor 280 is placed at the same side as coil 275. For comparison, some dimensions of the components are assumed the same between FIGS. 2A and 2B as indicated in the figures. Therefore, between FIGS. 1A and 2B, it is clear that the height or thickness of the PCB in FIG. 2A may be reduced by at least the height of embedded coil 235 (e.g., h5), assuming that the other dimensions do not change and the height of position sensor 280 is less than that of embedded coil 235 (e.g., h1<h5). Further, as shown in FIG. 1A, the space underneath PCB 220 may be a readily-available space, which would otherwise be unoccupied and wasted in traditional designs as shown in FIG. 2B. Thus, moving position sensor 240 to the underneath side of PCB 220 may utilize this readily-available space to help reduce the size of the PCB, especially if position sensor 240 is taller than embedded coil 235. With position sensor 240 at the underneath side, the above described height or thickness reduction for the PCB by embedding coil 235 inside PCB 220 can still occur even if other layers of PCB 220 (e.g., ceramic portion 230) need to get thicker to provide clearance for position sensor 240. In addition, recess 252 may further offset at least some of the need of the clearance for position sensor 240.

Figure 3A:
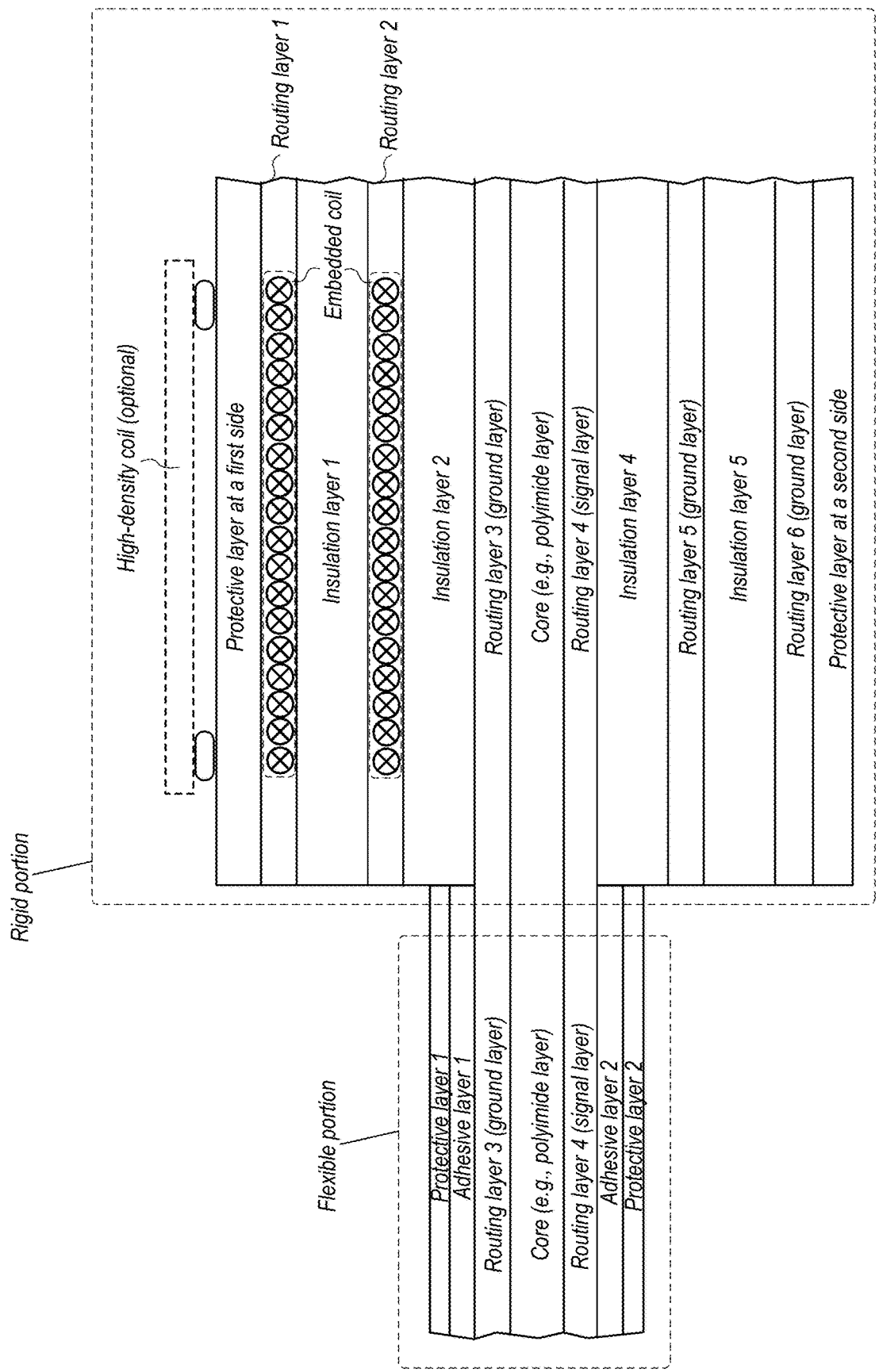
FIG. 3A shows the layer stack-up of an example PCB, according to some embodiments.

FIG. 3A shows the layer stack-up of an example PCB, according to some embodiments. For purposes of illustration, in this example, the PCB is a rigid-flex PCB that includes both a rigid portion (e.g., a hardboard) and a flexible portion (e.g., a flexible circuit). Note that the example may also illustrate the layer stack-up of a rigid PCB that includes only a rigid portion but not a flexible portion. In this example, the rigid portion of the PCB may include six inner layers (e.g., routing layer 1, routing layer 2, . . . , routing layer 6), a core layer, insulation layers (e.g., insulation layer 1, insulation layer 2, . . . , insulation layer 5) for insulating the adjacent routing layers, and two outer protective layers. The flexible portion of the PCB may include two inner layers on each side of the core layer that are connected to routing layer 3 and routing layer 4 of the rigid portion of the PCB. In this example, routing layer 3 is used as a ground layer, whilst layer 4 is used to route signal traces. Thus, the flexible portion of the PCB may connect the ground and signal traces from the rigid portion of the PCB to another portion of the PCB (e.g., to another rigid portion of the PCB) and/or to another component separate from the PCB. The flexible portion of the PCB may further include adhesive layers to join the inner layers with the outer protective layers. As shown in FIG. 3A, one or more coils may be embedded inside the rigid portion of the PCB, e.g., at routing layer 1 and routing layer 2. Further, one or more optional, high-density coils may be placed outside the PCB and connected to the embedded coils inside the PCB.

FIG. 3B is a table showing an example structure of a PCB at two areas with and without a recess, according to some embodiments. In this example, the PCB (e.g., like PCB 120 and 220 in FIGS. 1-2) may include eight internal layers (e.g., routing layer 1, routing layer 2, . . . , routing layer 8) each of which may be separated from an adjacent routing layer using an insulation layer (e.g., insulation layer 1, insulation layer 2, . . . , insulation layer 8), a core layer, and two protective layers at each side of the PCB. Note that the term "routing layer" may broadly refer to an internal layer of a PCB that may be used to route a trace such as a signal trace, a power or ground trace, and/or an embedded coil. As shown in FIG. 3A, each cell in the table may indicate a height or thickness of the corresponding layer. For instance, h(rl4) may refer to the height or thickness of the routing layer 4 of the PCB. In this example, the recess may be created by including fewer number of layers at the area of the recess (e.g., by removing layers 5-8) than the area without the recess, as indicated in FIG. 3A. Alternatively, in some embodiments, the recess may be created by reducing the heights or thickness of one or more layers of the PCB at the area of the recess than the area without the recess. For instance, the height or thickness of the routing layer 5 at the area of the recess may be reduced to be less than the height or thickness of the routing layer 5 at the area without the recess. Note that the above example in FIG. 3A is provided only as an example for purposes of illustration. The structure of the PCB (including, e.g., the number of layers and/or heights of the layers) may be different in some embodiments.

Figure 4:
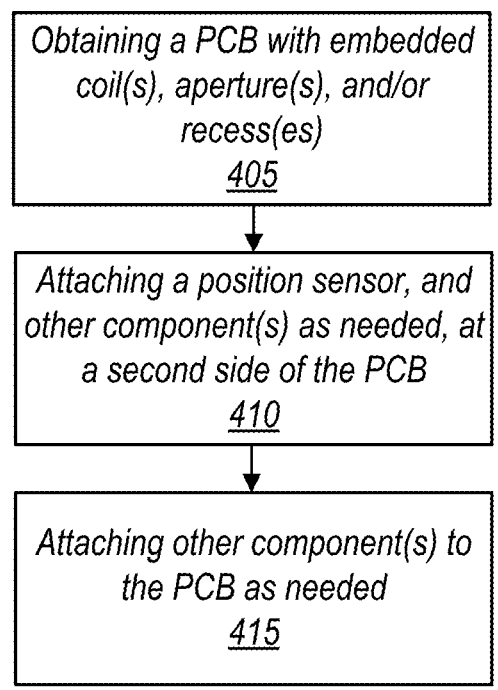
FIG. 4 is a high-level diagram flowchart showing methods and techniques for forming an example PCB, according to some embodiments.

FIG. 4 is a high-level diagram flowchart showing methods and techniques for forming an example PCB, according to some embodiments. As shown in this example, in some embodiments, a PCB may be obtained that may include one or more coils, aperture, and/or recesses, as indicated by block 405. As described above, the coils may be embedded at least partially inside the PCB at a first side of the PCB. The aperture may be created through the PCB at a specified location, e.g., proximate a position sensor is to be mounted at a second side opposite the first side of the PCB and/or in-between the position sensor and at least one corresponding magnet. Further, the recess may be formed at the PCB at the second side at a specified location, e.g., at the location where the position sensor is to be mounted. In some embodiments, the position sensor may be attached to the PCB at the second side of the PCB, as indicated by block 410. As described above, in some embodiments, the position sensor may be mounted to the second side of the PCB inside a recess, such that the total height or thickness of the PCB may be reduced. In some embodiments, one or more other components, such as a ceramic portion of the PCB and/or a driver for the coil, may be attached to the PCB (e.g., the organic portion of the PCB) as the same side, e.g., the second side, of the PCB as the position sensor. As described above, because all the components are now positioned at the same side of the PCB, they may be mounted to the PCB within one single reflow process. In some embodiments, one or more additional components may be attached to the PCB, e.g., at the first and/or second sides of the PCB, as indicated by block 415. For instance, one or more additional higher-density coils may be attached to the PCB at the first side of the PCB. In some embodiments, the higher-density coils may be positioned completely outside the PCB and may be electrically coupled with the embedded coils. In some embodiments, the camera may include no component distinct from the image sensor, except the higher-density coils, mounted at the first second side of the PCB. It means that the components may all be mounted at the same side, e.g., the second side, of the PCB in order to reduce the reflows and simplify manufacturing process of the PCB.

Figure 5:
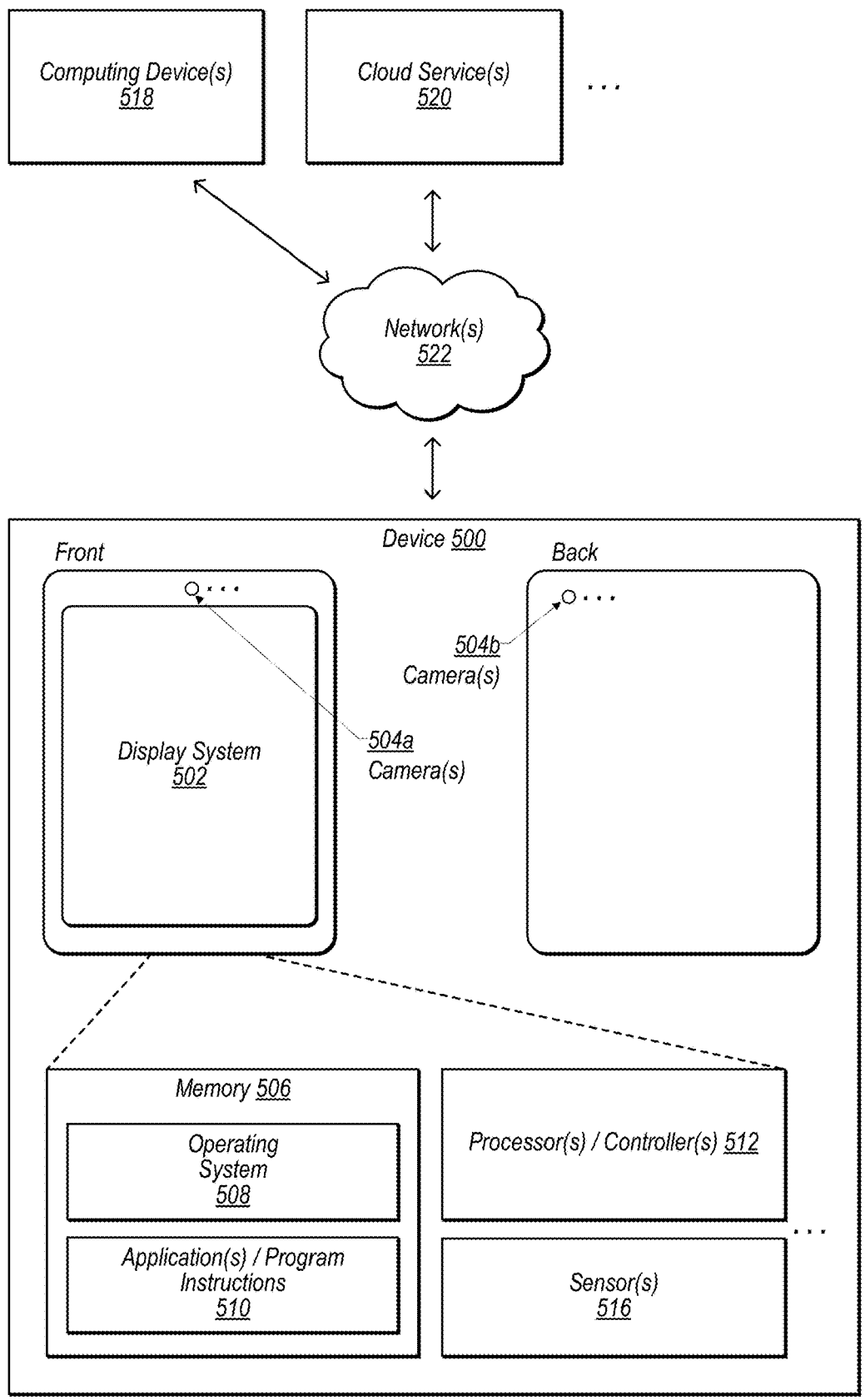
FIG. 5 illustrates a schematic representation of an example device that may include a camera including a PCB, according to some embodiments.

FIG. 5 illustrates a schematic representation of an example device 500 that may include a camera (e.g., the camera described above in FIGS. 1-4) including a PCB arranged as described herein, according to some embodiments. In some embodiments, the device 500 may be a mobile device and/or a multifunction device. In various embodiments, the device 500 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In some embodiments, the device 500 may include a display system 502 (e.g., comprising a display and/or a touch-sensitive surface) and/or one or more cameras 504. In some non-limiting embodiments, the display system 502 and/or one or more front-facing cameras 504a may be provided at a front side of the device 500, e.g., as indicated in FIG. 5. Additionally, or alternatively, one or more rear-facing cameras 504b may be provided at a rear side of the device 500. In some embodiments comprising multiple cameras 504, some or all of the cameras may be the same as, or similar to, each other. Additionally, or alternatively, some or all of the cameras may be different from each other. In various embodiments, the location(s) and/or arrangement(s) of the camera(s) 504 may be different than those indicated in FIG. 5.

Among other things, the device 500 may include memory 506 (e.g., comprising an operating system 508 and/or application(s)/program instructions 510), one or more processors and/or controllers 512 (e.g., comprising CPU(s), memory controller(s), display controller(s), and/or camera controller(s), etc.), and/or one or more sensors 516 (e.g., orientation sensor(s), proximity sensor(s), and/or position sensor(s), etc.). In some embodiments, the device 500 may communicate with one or more other devices and/or services, such as computing device(s) 518, cloud service(s) 520, etc., via one or more networks 522. For example, the device 500 may include a network interface (e.g., network interface 510) that enables the device 500 to transmit data to, and receive data from, the network(s) 522. Additionally, or alternatively, the device 500 may be capable of communicating with other devices via wireless communication using any of a variety of communications standards, protocols, and/or technologies.

Figure 6:
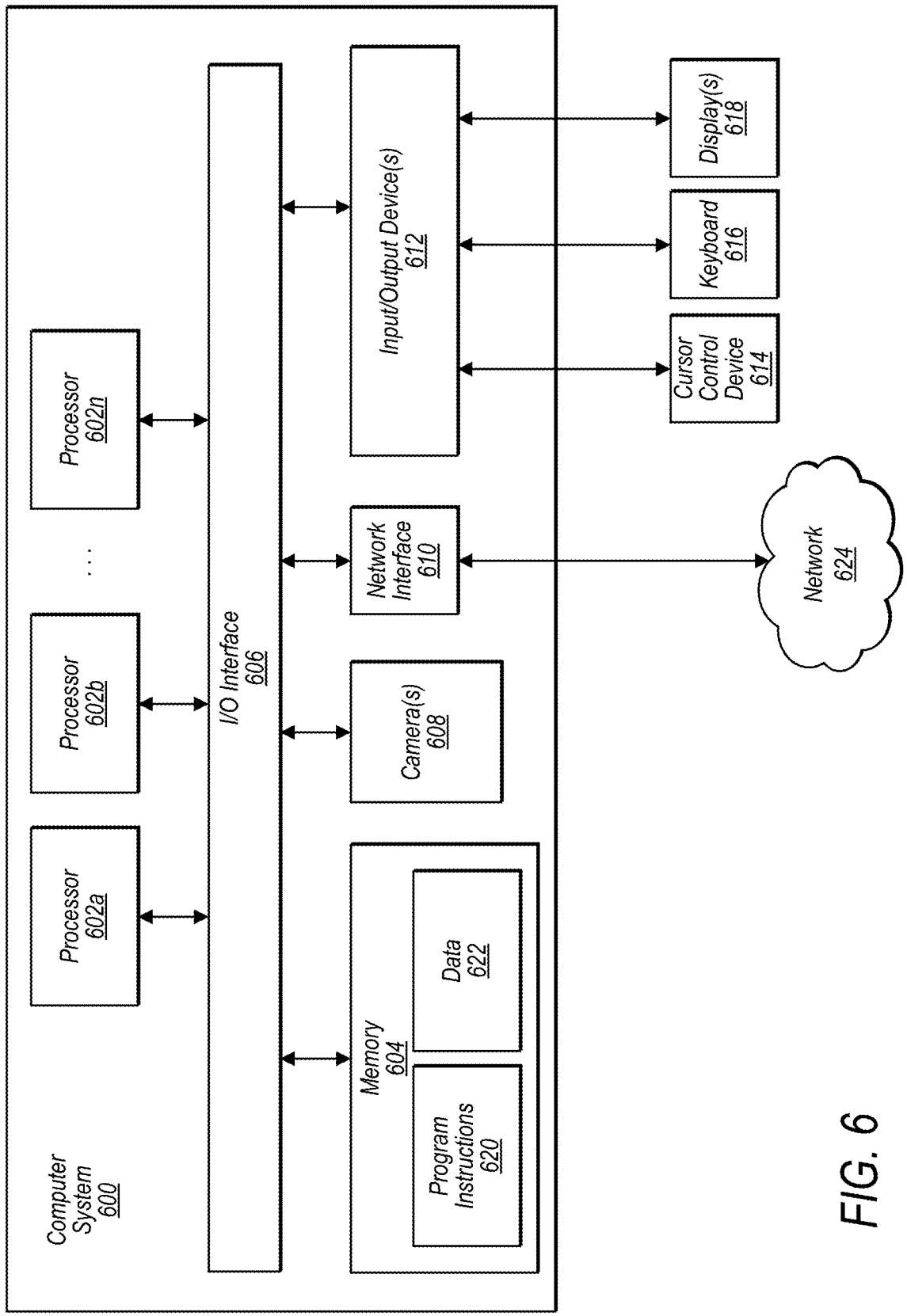
FIG. 6 illustrates a schematic block diagram of an example computer system that may include a camera having a PCB, according to some embodiments.

FIG. 6 illustrates a schematic block diagram of an example computing device, referred to as computer system 600, that may include or host embodiments of a camera including a PCB arrangement, e.g., as described herein with reference to FIGS. 1-5, according to some embodiments. In addition, computer system 600 may implement methods for controlling operations of the camera and/or for performing image processing images captured with the camera. In some embodiments, the device 500 (described herein with reference to FIG. 5) may additionally, or alternatively, include some or all of the functional components of the computer system 600 described herein.

The computer system 600 may be configured to execute any or all of the embodiments described above. In different embodiments, computer system 600 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 600 includes one or more processors 602 coupled to a system memory 604 via an input/output (I/O) interface 606. Computer system 600 further includes one or more cameras 608 coupled to the I/O interface 606. Computer system 600 further includes a network interface 610 coupled to I/O interface 606, and one or more input/output devices 612, such as cursor control device 614, keyboard 616, and display(s) 618. In some cases, it is contemplated that embodiments may be implemented using a single instance of computer system 600, while in other embodiments multiple such systems, or multiple nodes making up computer system 600, may be configured to host different portions or instances of embodiments. For example, in one embodiment some elements may be implemented via one or more nodes of computer system 600 that are distinct from those nodes implementing other elements.

In various embodiments, computer system 600 may be a uniprocessor system including one processor 602, or a multiprocessor system including several processors 602 (e.g., two, four, eight, or another suitable number). Processors 602 may be any suitable processor capable of executing instructions. For example, in various embodiments processors 602 may be general-purpose or embedded processors implementing any of a variety of instruction set architectures (ISAs), such as the x86, PowerPC, SPARC, or MIPS ISAs, or any other suitable ISA. In multiprocessor systems, each of processors 602 may commonly, but not necessarily, implement the same ISA.

System memory 604 may be configured to store program instructions 620 accessible by processor 602. In various embodiments, system memory 604 may be implemented using any suitable memory technology, such as static random access memory (SRAM), synchronous dynamic RAM (SDRAM), nonvolatile/Flash-type memory, or any other type of memory. Additionally, existing camera control data 622 of memory 604 may include any of the information or data structures described above. In some embodiments, program instructions 620 and/or data 622 may be received, sent or stored upon different types of computer-accessible media or on similar media separate from system memory 604 or computer system 600. In various embodiments, some or all of the functionality described herein may be implemented via such a computer system 600.

In one embodiment, I/O interface 606 may be configured to coordinate I/O traffic between processor 602, system memory 604, and any peripheral devices in the device, including network interface 610 or other peripheral interfaces, such as input/output devices 612. In some embodiments, I/O interface 606 may perform any necessary protocol, timing or other data transformations to convert data signals from one component (e.g., system memory 604) into a format suitable for use by another component (e.g., processor 602). In some embodiments, I/O interface 606 may include support for devices attached through various types of peripheral buses, such as a variant of the Peripheral Component Interconnect (PCI) bus standard or the Universal Serial Bus (USB) standard, for example. In some embodiments, the function of I/O interface 606 may be split into two or more separate components, such as a north bridge and a south bridge, for example. Also, in some embodiments some or all of the functionality of I/O interface 606, such as an interface to system memory 604, may be incorporated directly into processor 602.

Network interface 610 may be configured to allow data to be exchanged between computer system 600 and other devices attached to a network 624 (e.g., carrier or agent devices) or between nodes of computer system 600. Network 624 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 610 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 612 may, in some embodiments, include one or more display terminals, keyboards, keypads, touchpads, scanning devices, voice or optical recognition devices, or any other devices suitable for entering or accessing data by one or more computer systems 600. Multiple input/output devices 612 may be present in computer system 600 or may be distributed on various nodes of computer system 600. In some embodiments, similar input/output devices may be separate from computer system 600 and may interact with one or more nodes of computer system 600 through a wired or wireless connection, such as over network interface 610.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A system, comprising:
a lens group including one or more lenses;
an image sensor configured to generate image signals based on light passing through the lens group; and
a printed circuit board (PCB) that comprises:
at least one coil of an actuator configured to move at least one of the lens group or the image sensor, wherein the at least one coil is embedded at least partially inside the PCB at a first side of the PCB, wherein the first side of the PCB is an object side of the PCB; and
at least one sensor that is attached to the PCB at a second side of the PCB opposite the first side of the PCB and adjacent an aperture extending through the PCB, wherein the sensor is configured to provide information indicating a relative distance between the image sensor and the lens group, wherein the second side of the PCB is an image side of the PCB.

2. The system of claim 1, wherein the image sensor is also attached to the PCB.

3. The system of claim 1, wherein the at least one sensor is a surface mount device and is configured such that, when attached to the second side of the PCB, the at least one sensor provides a larger sensing output compared to when the sensor is attached to the first side of the PCB.

4. The system of claim 1, wherein the PCB includes at least one recess at the second side of the PCB, and wherein the at least one sensor is attached to the PCB inside the recess.

5. The system of claim 1, further comprising at least another coil of the actuator that is positioned outside the PCB and coupled with the at least one coil embedded at least partially inside the PCB.

6. The system of claim 1, wherein the PCB further comprises at least one driver for the at least one coil of the actuator, and wherein the at least one driver is attached to the PCB at the second side of the PCB.

7. The system of claim 1, wherein the PCB includes an organic portion and a ceramic portion, and wherein the ceramic portion is attached to the organic portion of the PCB at the second side of the PCB.

8. The system of claim 1, wherein the at least one sensor is a magnetoresistive (MR) sensor.

9. The system of claim 1, wherein the actuator is a voice coil motor (VCM) actuator.

10. A device, comprising:
a lens group including one or more lenses;
an image sensor configured to generate image signals based on light passing through the lens group;
a processor configured to process the image signals from the image sensor to generate an image; and
a printed circuit board (PCB) that comprises:
at least one coil of an actuator configured to move at least one of the lens group or the image sensor, wherein the at least one coil is embedded at least partially inside the PCB at a first side of the PCB, wherein the first side of the PCB is an object side of the PCB; and
at least one sensor that is attached to the PCB at a second side of the PCB opposite the first side of the PCB and adjacent an aperture extending through the PCB, wherein the sensor is configured to provide information indicating a relative distance between the image sensor and the lens group, wherein the second side of the PCB is an image side of the PCB.

11. The device of claim 10, wherein the image sensor is also attached to the PCB.

12. The device of claim 10, wherein the at least one sensor is a surface mount device and is configured such that, when attached to the second side of the PCB, the at least one sensor provides a larger sensing output compared to when the at least one sensor is attached to the first side of the PCB.

13. The device of claim 10, wherein the PCB includes at least one recess at the second side of the PCB, and wherein the at least one sensor is attached to the PCB inside the recess.

14. The device of claim 10, further comprising at least another coil of the actuator that is positioned outside the PCB and coupled with the at least one coil embedded at least partially inside the PCB.

15. The device of claim 10, wherein a portion of the PCB where the at least one coil is embedded is a rigid portion, and wherein other portions of the PCB include a rigid portion or a flexible portion.

16. The device of claim 10, wherein the PCB includes an organic portion and a ceramic portion, and wherein the ceramic portion is attached to the organic portion of the PCB at the second side of the PCB.

17. The device of claim 10, wherein the at least one sensor is a magnetoresistive (MR) sensor.

18. A method, comprising:
obtaining a printed circuit board (PCB) that includes (1) at least one coil embedded at least partially inside the PCB at a first side of the PCB and (2) at least one aperture extending through the PCB at a location corresponding to at least one position sensor, wherein the first side of the PCB is an object side of the PCB; and attaching the at least one position sensor to the PCB at a second side opposite the first side of the PCB, wherein the position sensor is positioned proximate the aperture extending through the PCB, wherein the second side of the PCB is an image side of the PCB.

\* \* \* \* \*